(12) United States Patent
Hirose et al.

(10) Patent No.: US 8,332,202 B2
(45) Date of Patent: Dec. 11, 2012

(54) HYBRID SYSTEM SIMULATION METHOD AND SIMULATION PROGRAM PRODUCT

(75) Inventors: Shinichi Hirose, Kanagawa (JP); Hiroshi Ishikawa, Kanagawa (JP); Ryo Kawahara, Kanagawa (JP); Hiroaki Nakamura, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 12/724,700

(22) Filed: Mar. 16, 2010

(65) Prior Publication Data

US 2010/0250226 A1 Sep. 30, 2010

(30) Foreign Application Priority Data

Mar. 24, 2009 (JP) .................. 2009-071789

(51) Int. Cl.
G06G 7/62 (2006.01)
G06F 17/10 (2006.01)
G05B 19/18 (2006.01)
G05B 13/02 (2006.01)

(52) U.S. Cl. ............ 703/17; 703/2; 700/31; 700/6
(58) Field of Classification Search ............ 700/6, 31; 703/17, 2

See application file for complete search history.

(56) References Cited

U.S. PATENT DOCUMENTS

| | | | | |
|---|---|---|---|---|
| 3,909,597 A | * | 9/1975 | Dunn et al. ............ | 708/2 |
| 4,977,529 A | * | 12/1990 | Gregg et al. ............ | 703/18 |
| 5,701,439 A | * | 12/1997 | James et al. ............ | 703/17 |
| 5,732,192 A | * | 3/1998 | Malin et al. ............ | 703/2 |
| 5,963,724 A | * | 10/1999 | Mantooth et al. ............ | 703/14 |
| 6,324,495 B1 | * | 11/2001 | Steinman ............ | 703/17 |
| 7,246,054 B2 | * | 7/2007 | Szymanski et al. ............ | 703/17 |
| 7,580,813 B2 | * | 8/2009 | Thiesson et al. ............ | 703/2 |
| 7,689,296 B2 | * | 3/2010 | Backstrom et al. ............ | 700/31 |
| 2009/0179921 A1 | * | 7/2009 | Raghavan et al. ............ | 345/689 |

FOREIGN PATENT DOCUMENTS

JP 2010224894 A * 10/2010

OTHER PUBLICATIONS

IEEE paper "Formal Definitions of Simulation Interfaces in a Continuous/Discrete Co-simulation Tool" by Luiza Gheorghe et al (IEEE 2006, pp. 1-7).*
Jozef Hooman et al, "Validating UML models of Embedded Systems by Coupling Tools," Proceedings SVERTS, 2004, Embedded Sys Inst., Eindhoven & Univ. of Nijmegen, Netherlands, pp. 1-17.
F. Bouchhima et al, "A SystemC/Simulink Co-Simulation Framework for Continuous/Discrete-Events Simulation," Behavioral Modeling & Simulation Workshop, 2006 IEEE International, pp. 1-6.

* cited by examiner

Primary Examiner — Kamini S Shah
Assistant Examiner — Akash Saxena
(74) Attorney, Agent, or Firm — Vazken Alexanian

(57) ABSTRACT

A technique for enhancing the execution efficiency of simulation of a hybrid system. A continuous system simulator receives a request for evaluation of an event generating conditional expression for an event to be processed by a discrete system simulator, from the discrete system simulator. The event generating conditional expression is evaluated by referring to the value of a first variable describing a continuous system. Until evaluation of the event generating conditional expression indicates true, the continuous system simulator repeats simulation of advancing the current time by a step time interval and evaluation of the event generating conditional expression. When evaluation of the event generating conditional expression indicates true, the continuous system simulator sends current time data and the value of a second variable describing the continuous system which is referred to by the discrete simulator, to the discrete simulator.

11 Claims, 12 Drawing Sheets

(a) DISCRETE-CONTINUOUS CORRESPONDENCE TABLE T1

| NAME IN DISCRETE SYSTEM MODEL | NAME IN CONTINUOUS SYSTEM MODEL |
|---|---|
| fan_power_out | fan_wat_in |
| target_humidity_out | target_humidity_in |
| mode_out | mode_in |

(b) CONTINUOUS-DISCRETE CORRESPONDENCE TABLE T2

| NAME IN CONTINUOUS SYSTEM MODEL | NAME IN DISCRETE SYSTEM MODEL |
|---|---|
| water_temperature_out | water_temperature_in |
| water_volume_out | water_volume_in |

FIG. 5

CONDITIONAL EXPRESSION TABLE T3

| ID | CONDITIONAL EXPRESSION | VARIABLE IN DISCRETE SYSTEM MODEL TO BE REFERRED TO |
|---|---|---|
| Exp1 | water_temperature_out <= safe_temperature | {safe_temperature} |
| Exp2 | water_temperature_out >= 99 | { } |
| Exp3 | water_volume_out == 0 | { } |
| Exp4 | water_temperature_out <= safe_temperature | {safe_temperature} |

FIG. 7

(a) CONDITIONAL EXPRESSION ACTIVENESS TABLE T4

| ID | ACTIVE/INACTIVE |
|---|---|
| Exp1 | INACTIVE |
| Exp2 | INACTIVE |
| Exp3 | INACTIVE |
| Exp4 | INACTIVE |

(b) CONDITIONAL EXPRESSION ACTIVENESS TABLE T5

| ID | ACTIVE/INACTIVE |
|---|---|
| Exp1 | INACTIVE |
| Exp2 | INACTIVE |
| Exp3 | INACTIVE |
| Exp4 | INACTIVE |

(c) DISCRETE SYSTEM MODEL VARIABLE VALUE TABLE T6

| VARIABLE NAME | VALUE |
|---|---|
| safe_temperature | UNDECIDED |

FIG. 9

| STATE OF DISCRETE SYSTEM MODEL | ID OF ACTIVE CONDITIONAL EXPRESSION |
|---|---|
| On && WarmUp | Exp2, Exp3 |
| On && Running | Exp3 |
| WaterSortage && CoolDown | Exp4 |
| WaterSortage && Suspended | - |
| Off && CoolDown | Exp1 |
| Off && Standby | - |

FIG. 12

HYBRID SYSTEM SIMULATION METHOD AND SIMULATION PROGRAM PRODUCT

CROSS-REFERENCE TO RELATED APPLICATION

This application claims priority under 35 U.S.C. §119 from Japanese patent Application No. 200971789 filed Mar. 24, 2009, the entire contents of which are incorporated by reference herein.

BACKGROUND OF THE INVENTION

1. Field of the Invention

The present invention relates to a technique for causing a continuous system simulator and a discrete system simulator that simulate the discrete behavior and the continuous behavior of a hybrid system, respectively, to efficiently operate in collaboration with each other. More particularly, the present invention relates to a technique for reducing the amount of data communication between the continuous system simulator and the discrete system simulator.

2. Description of the Related Art

In development of a system, it is important to verify the specifications and design of the whole system at an upstream process in order to minimize rework. Such verification is often performed by simulation, which models the system. In the field of system engineering including machinery, electricity and software, it is necessary to express a system as a hybrid system in which a discrete system and a continuous system are mixed because the system behaves both discretely and continuously.

For example, in Systems Modeling Language (SysML), which is Unified Modeling Language (UML) extended for system engineering, extension for enabling description of a structure, which handles continuous data in addition to discrete data, is made to describe a hybrid system. Here, a discrete behavior is described in a SysML state machine diagram, for example. On the other hand, an algorithm for calculating a continuous quantity on continuous time is described in another modeling language, for example, Simulink™ by The MathWorks, Inc. By describing continuous data in a manner that it is received and transmitted via a SysML flow port, it is possible to describe the behavior of a hybrid system configured by a discrete system and a continuous system.

The above is an example of a method for describing a hybrid system. In a hybrid system, it is generally one of the keys to enhance the execution efficiency of simulation to cause a discrete system simulator and a continuous system simulator to operate well in collaboration with each other. In order for a discrete system simulator and a continuous system simulator to perform in collaboration with each other, it is necessary that both simulators share time and data. Therefore, when one simulator updates time or data, this update must be correctly reflected on simulation by the other simulator. However, if time or data is exchanged immediately after each update, the number of communications between both simulators increases considerably. As a result, the execution efficiency of simulation deteriorates.

For example, in "A SystemC/Simulink Co-Simulation Framework for Continuous/Discrete-Events Simulation" by Bouchhima, F. et al (Proceedings of the 2006 IEEE International Behavioral Modeling and Simulation Workshop, 2006) a technique is disclosed in which, in simulation of a hybrid system configured by a discrete system described in UML and a continuous system described in Simulink, execution/management of co-simulation is performed under the leadership of a continuous system simulator.

In "Validating UML models of Embedded Systems by Coupling Tools" by Jozef Hooman et al (Proceedings of the Workshop on Specification and Validation of UML models for Real-Time and Embedded Systems, 2004) a technique is disclosed in which, in simulation of a hybrid system configured by a discrete system described in SystemC and a continuous system described in Simulink, execution/management of co-simulation is performed under the leadership of a discrete system simulator.

In both of the above techniques, synchronization of time and data is performed for each step time of simulation by a continuous system simulator. Therefore, the amount of communication between a discrete system simulator and a continuous system simulator increases, and it is not possible to efficiently perform simulation in the conventional techniques.

SUMMARY OF THE INVENTION

In the present invention, as for those evaluated by referring to the value of a variable describing a continuous system, among event generating conditional expressions for events to be processed by a discrete system simulator, evaluation thereof is performed on the continuous system simulator side first, in order to eliminate unnecessary communication between the discrete system simulator and the continuous system simulator. For the discrete system simulator, it is when the discrete system simulator starts processing of an event that it needs to refer to the newest value of data of the other simulator. Therefore, according to the above configuration, the continuous system simulator does not have to notify a result of simulation to the discrete system simulator at each step time interval unless a result of an event generating conditional expression indicates true.

In the present invention, only those which are currently assumed to possibly generate an event in a discrete system model and, therefore, need to be evaluated, among one or more event generating conditional expressions evaluated by referring to the value of a variable among variables describing the continuous system, are evaluated on the continuous system simulator side. According to such a configuration, it is eliminated to wastefully evaluate an event generating conditional expression in the continuous system simulator. Furthermore, it is possible to further reduce the number of communications between both simulators.

Furthermore, in the present invention, it is assumed that, as for such that the processing start time is scheduled in advance among events to be processed by a discrete system simulator, the discrete system simulator notifies the schedule to a continuous system simulator at a timing of synchronizing the time and data. According to such a configuration, the continuous system simulator does not have to synchronize with the discrete system simulator at all until the result of simulation performed at each step time interval becomes a factor for occurrence of an event in the discrete system model or until the scheduled event occurrence time comes.

A continuous system simulation program that simulates the behavior of a continuous system constituting a hybrid system together with a discrete system while communicating with a discrete system simulation program that simulates the behavior of the discrete system, according to a first aspect of the present invention causes a computer to execute: receiving a request for evaluation of an event generating conditional expression for an event to be processed by the discrete system simulation program from the discrete system simulation program, wherein the event generating conditional expression is evaluated by referring to the value of at least one continuous system variable among multiple continuous system variables describing the continuous system; repeating simulation of advancing the current time of the continuous system by a step time interval and evaluation of the event generating conditional expression until evaluation of the event generating conditional expression indicates true, in response to the receiving of the request for evaluation; and sending current time data indicating the current time and the value of at least one continuous system variable referred to in simulation of the discrete system among the multiple continuous system variables to the discrete system simulation program, in response to evaluation of the event generating conditional expression indicating true.

The at least one continuous system variable referred to for the event generating conditional expression and the at least one continuous system variable referred to in simulation of the discrete system may be different from each other, or a part or all of them may overlap with each other. The computer in which the continuous system simulation program is installed and executed may be identical with the computer in which the discrete system simulation program is installed and executed or may be different from that.

A discrete system simulation program that simulates the behavior of a discrete system constituting a hybrid system together with a continuous system while communicating with a continuous system simulation program that simulates the behavior of the continuous system, according to a second aspect of the present invention causes a computer to execute: processing an event that occurs at the current time; sending a request for evaluation of an event generating conditional expression evaluated by referring to the value of at least one continuous system variable among multiple continuous system variables, which are variables describing the continuous system to the continuous system simulation program, in response to the end of the processing of the event; receiving current time data indicating the time when the result of evaluation of the event generating conditional expression indicates true and the value of at least one continuous system variable referred in simulation of the discrete system among the multiple continuous system variables from the continuous system simulation program; recording the received value of at least one continuous system variable to a storage section of the computer; and updating the current time with the received current time data.

The at least one continuous system variable referred to for the event generating conditional expression and the at least one continuous system variable referred to in simulation of the discrete system may be different from each other, or a part or all of them may overlap with each other. The computer in which the discrete system simulation program is installed and executed may be identical with the computer in which the continuous system simulation program is installed and executed or may be different from that.

A simulation program product for a hybrid system according to a third aspect of the present invention includes: a discrete system simulation program that simulates the behavior of a discrete system constituting the hybrid system and a continuous system simulation program that simulates the behavior of a continuous system constituting the hybrid system while communicating with the program. The discrete system simulation program causes the computer to execute: processing an event that occurs at the current time in the discrete system; and handing over a request for evaluation of an event generating conditional expression evaluated by referring to the value of at least one continuous system variable among multiple continuous system variables, which are variables describing the continuous system to the continuous system simulation program, in response to the end of the processing of the event.

The present invention has been described above as a continuous system simulation program, a continuous system simulation program, and a hybrid system simulation program configured by a continuous system and a discrete system. However, the present invention can be also grasped as a method for simulating a continuous system constituting a hybrid system and a method for simulating a discrete system constituting the hybrid system.

According to the present invention, as unnecessary communication between a discrete system simulator and a continuous system simulator is eliminated, it is possible to reduce the number of communications between both simulators. Therefore, according to the present invention, it is possible to enhance the execution efficiency of simulation of a hybrid system configured by a discrete system and a continuous system. Other advantages of the present invention will be understood from the description of the embodiment.

The present invention enhances the execution efficiency of simulation of a hybrid system configured by a discrete system and a continuous system. Furthermore, the present invention eliminates unnecessary communication between a discrete system simulator and a continuous system simulator and reduces the number of communications between both simulators.

BRIEF DESCRIPTION OF THE DRAWINGS

FIG. 5(a) shows an example of a discrete-continuous correspondence table T1 created in the preprocessing.

FIG. 5(b) shows an example of a continuous-discrete correspondence table T2 created in the preprocessing.

FIG. 7 shows an example of a conditional expression correspondence table T3 created in the preprocessing.

FIG. 9(a) shows an example of a conditional expression activeness table T4 created in the preprocessing.

FIG. 9(b) shows an example of a conditional expression activeness table T5 created in the preprocessing.

FIG. 9(c) shows an example of a discrete system model variable value table T6 created in the preprocessing.

FIG. 12 shows an example of a table of correspondence between states of the discrete system model and IDs of active event generating conditional expressions in the states.

DETAILED DESCRIPTION OF THE PREFERRED EMBODIMENTS

A preferred embodiment for practicing the present invention will be described below in detail on the basis of drawings. However, the embodiment below is not intended to limit the present invention to the scope of claims, and all the combination of the characteristics described in the embodiment are not necessarily indispensable for solution means of the invention. The same reference numbers are given to the same elements through the whole description of the embodiment.

The present invention is intended to, in conventional hybrid system simulation for performing simulation by modeling one system behaving both discretely and continuously as a hybrid system configured by a discrete system and a continuous system, enhance the execution efficiency of the simulation by causing a discrete system simulator that simulates the discrete system and a continuous system simulator that simulates the continuous system to operate well in collaboration with each other. That is, the present invention improves the amount of communication and the number of communications between a discrete system simulator and a continuous system simulator in conventionally known hybrid system simulation. Therefore, basically, a discrete system simulator and a continuous system simulator, which already exist, will be used below. Specifically, each of the base simulators may be any simulator that operates as described below.

Discrete System Simulator

The discrete system simulator is driven by an event. There are two kinds of events, that is, an event to be processed immediately and an event to be processed after a specified time. The discrete system simulator advances simulation by repeating waiting for occurrence of an event and processing in accordance with the following procedures with time t=0 as an initial value.

1. Performs processing of an event scheduled at time t. As a result of the processing of the event, an event may newly occur. For an event to be processed immediately, 1. is repeatedly executed. An event to be processed after a specified time $\Delta t$ is scheduled to be executed at time $t+\Delta t$.

2. When there is not an event to be processed at the time t any more, t is updated to a specified event occurrence time scheduled in the nearest future, and 1. is executed.

Continuous System Simulator

The continuous system simulator advances simulation by repeating calculation for each step time on the basis of what is obtained by describing a target expressed by a numerical expression, such as a differential equation, as a continuous value algorithm for calculating an output value from an input value, and setting the algorithm as a behavior model. The step time is given as a pair of adjoining times $t_i$ and $t_{i+1}$, and an output at the time $t_{i+1}$ is calculated on the basis of an input value at the time $t_i$.

Figure 1:
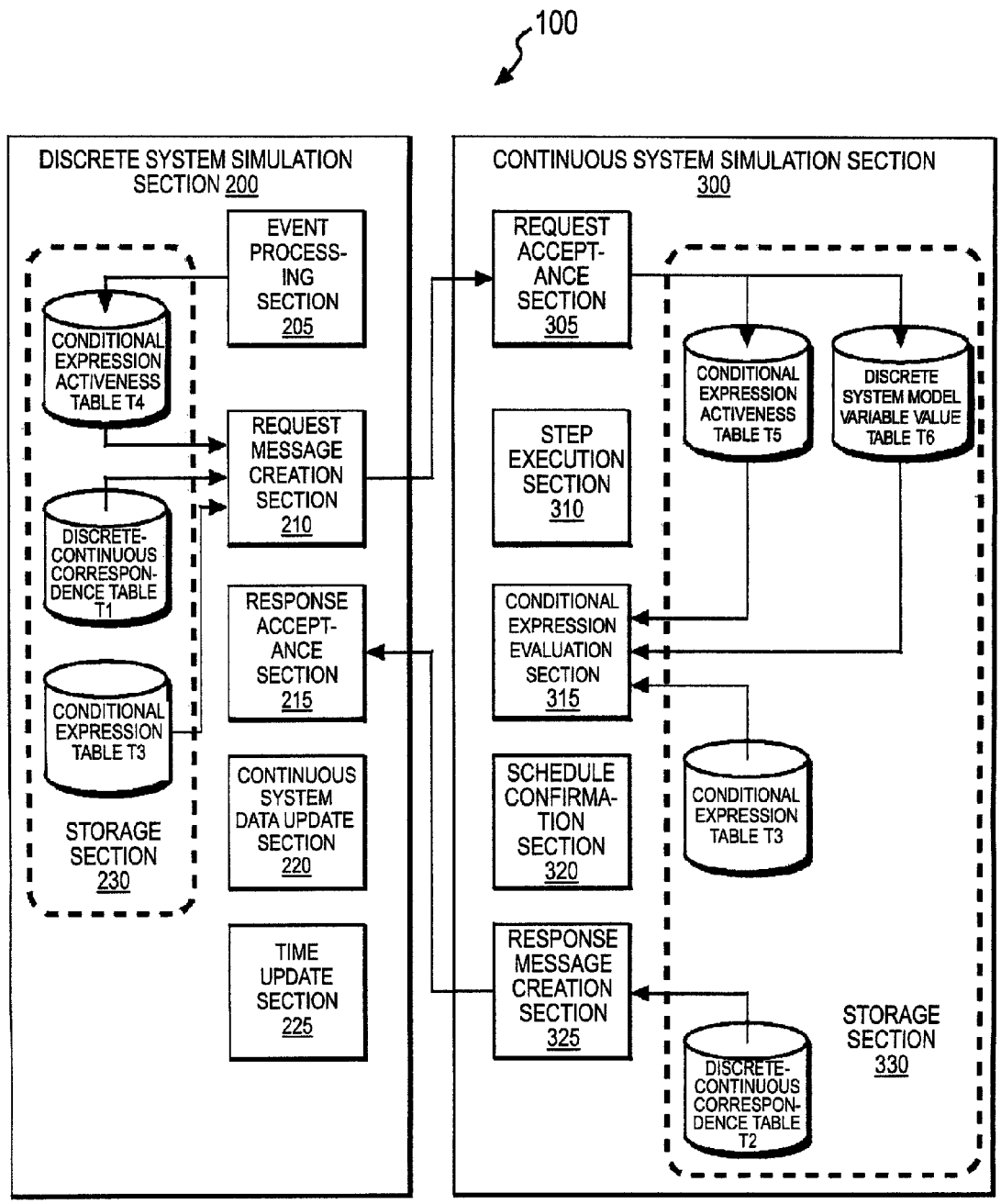
FIG. 1 shows an example of the functional configuration of a simulation apparatus 100 of a hybrid system according to this embodiment.

FIG. 1 shows an example of the functional configuration of a simulation apparatus 100 of a hybrid system according to an embodiment of the present invention which includes a discrete system simulation section 200. It simulates the behavior of a discrete system constituting the hybrid system. The present invention also includes a continuous system simulation section 300, which simulates the behavior of a continuous system constituting the hybrid system while communicating with the discrete system simulation section 200. The discrete system simulation section 200 according to the embodiment of the present invention is provided with an event processing section 205, a request message creation section 210, a response acceptance section 215, a continuous system data update section 220 and a time update section 225. The discrete system simulation section 200 is also provided with a data storage section 230 and stores a discrete-continuous correspondence table T1, a conditional expression correspondence table T3 and a conditional expression activeness table T4.

The continuous system simulation section 300 according to the embodiment of the present invention includes a request acceptance section 305, a step execution section 310, a conditional expression evaluation section 315, a schedule confirmation section 320 and a response message creation section 325. The continuous system simulation section 300 is also provided with a data storage section 330 and stores a continuous-discrete correspondence table T2, a conditional expression correspondence table T3, a conditional expression activeness table T5 and a discrete system model variable value table T6.

Figure 2:
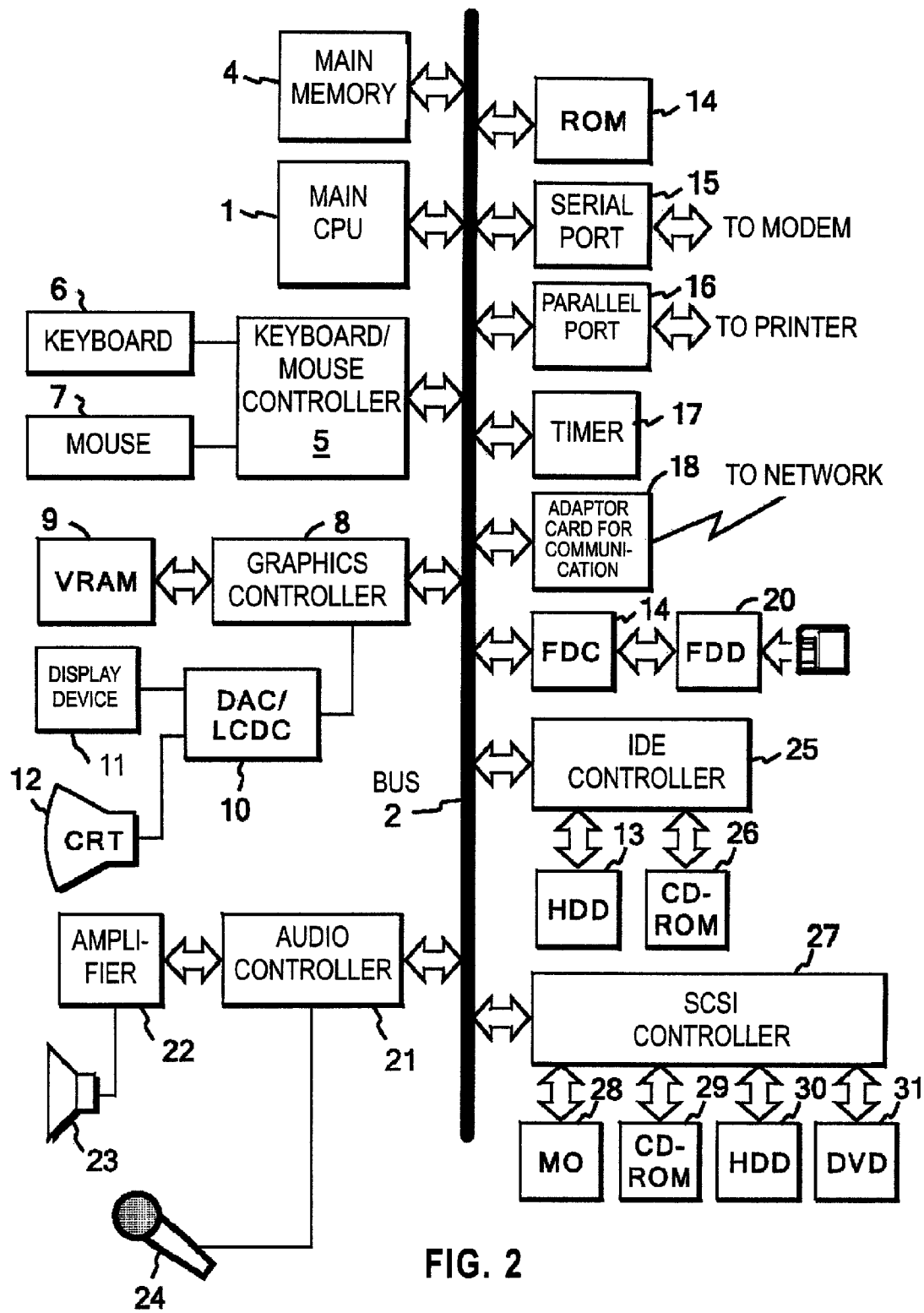
FIG. 2 shows an example of the hardware configuration of an information processing apparatus preferable for realizing the simulation apparatus 100 (a discrete system simulation section and a continuous system simulation section) of the hybrid system according to this embodiment.

The simulation apparatus 100 of the hybrid system according to this embodiment can be configured with the use of a general computer. In this case, the discrete system simulation section 200 and the continuous system simulation section 300 may be configured by multiple computers, which can communicate with each other or may be configured by the same one computer. FIG. 2 shows an example of a basic hardware configuration of such a general computer 50.

The computer 50 includes a CPU (central processing unit) 1 and a main memory 4, which are connected to a bus 2. Hard disk devices 13 and 30, and removable storages such as CD-ROM devices 26 and 29 (external storage systems for which a recording medium can be exchanged), a flexible disk device 20, an MO device 28 and a DVD device 31 are connected to the bus 2 via a floppy disk controller 19, an IDE controller 25, and a SCSI controller 27.

Storage media such as a flexible disk, MO, CD-ROM and DVD-ROM are inserted into the removable storages. A computer program code for giving instructions to the CPU in collaboration with an operating system to practice the present invention can be recorded in these storage media, the hard disk devices 13 and 30 and a ROM 14.

That is, in the various storage devices of the computer 50 as the simulation apparatus 100, which was described above, a discrete system simulation program, a continuous system simulation program and data used by each program, such as the discrete-continuous correspondence table T1 and the continuous-discrete correspondence table T2, can be stored. The computer programs are executed by being loaded onto the main memory 4. The computer programs can be also compressed or divided into multiple parts and stored in multiple media.

The computer 50 receives an input from an input device such as a keyboard 6 and a mouse 7 via a keyboard/mouse controller 5. The computer 50 receives an input from a microphone 24 via an audio controller 21 and outputs voice from a speaker 23. The computer 50 is connected to a display device 11 for presenting visual data to a user via a graphics controller 8. The computer 50 can connect to a network via a network adaptor 18 (an Ethernet® card or a token ring card) and communicate with other computers.

From the above description, it will be easily understood that a computer preferable for realizing the simulation apparatus 100 according to the embodiment of the present invention can be realized by an information processing apparatus, such as a common personal computer, workstation and mainframe, or by combination of these. The components described above have been illustrated as examples, and all of the components are not necessarily indispensable components of the present invention.

Before describing a concrete configuration and a processing procedure of the simulation apparatus 100 according to this embodiment, preprocessing required for practicing the present invention will be described with reference to FIGS. 3 to 9.

Figure 3:
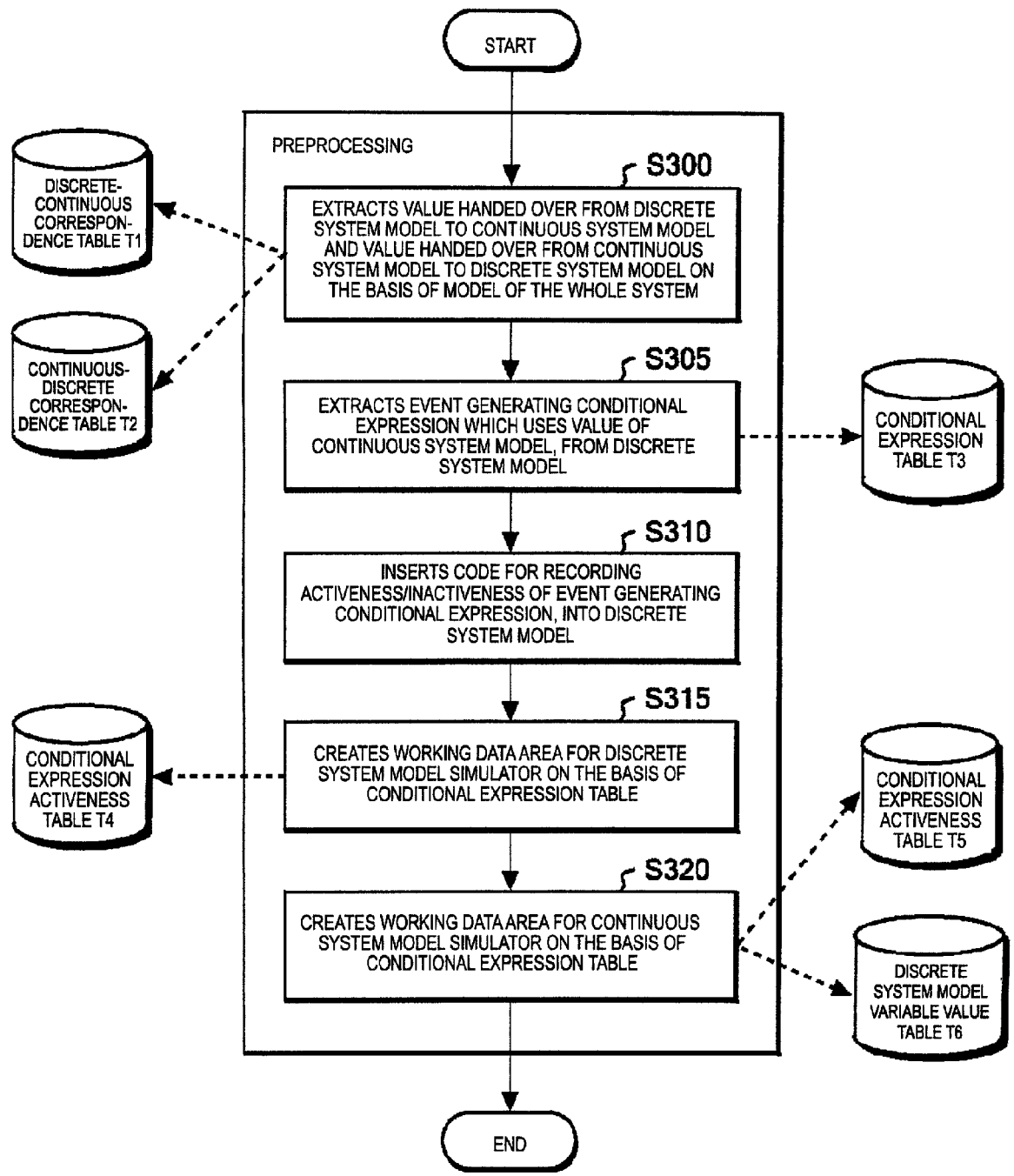
FIG. 3 shows a flowchart showing an example of the flow of preprocessing performed when simulation of the hybrid system according to this embodiment is executed.

FIG. 3 is a flowchart showing an example of the flow of the preprocessing. In the preprocessing, a value handed over from a discrete system model to a continuous system model (corresponding to "the value of a discrete system variable" described in claims) and a value handed over from the continuous system model to the discrete system model (corresponding to "the value of a continuous system variable" described in claims) are extracted first on the basis of a structure model of the whole system (step 300). In the description below, the discrete system variable will be described as a discrete system model variable, and the continuous system variable will be described as a continuous system model variable. The variable name of each of the extracted values is registered with the discrete-continuous correspondence table T1 or the continuous-discrete correspondence table T2. That is, as for the value handed over from the discrete system model to the continuous system model, its variable name in the discrete system model is registered with the discrete-continuous correspondence table T1 in association with its name in the continuous system model. Similarly, as for the value handed over from the continuous system model to the discrete system model, its variable name in the continuous system model is registered with the continuous-discrete correspondence table T2 in association with its name in the discrete system model.

Figure 4:
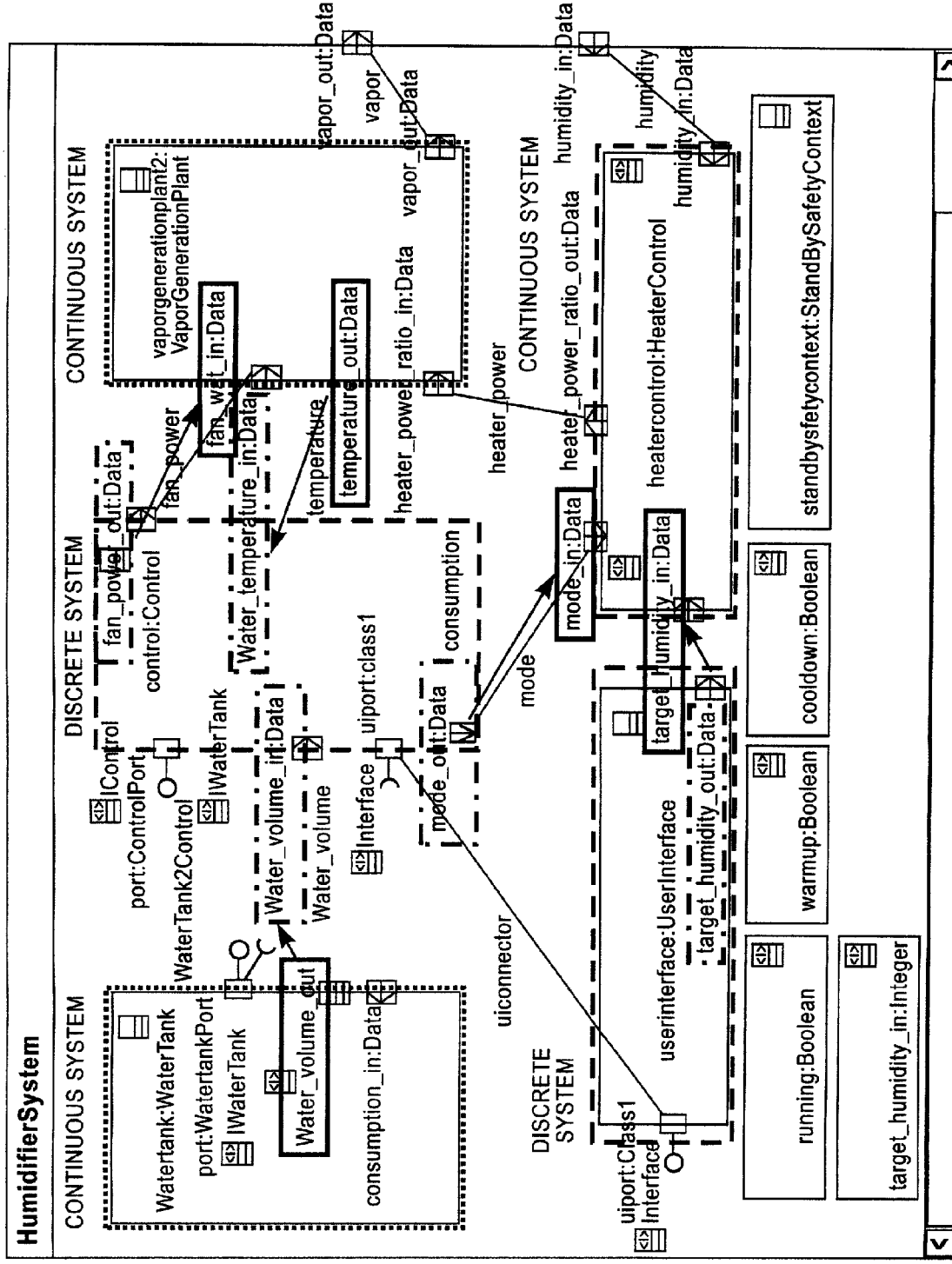
FIG. 4 shows an example of a structure model of a steam-type humidifier (hybrid system).

Now, the extraction processing described above will be described in more detail with a steam-type humidifier taken as an example of a hybrid system. FIG. 4 shows an example of a structure model of a steam-type humidifier. As shown in FIG. 4, a structure model of the steam-type humidifier includes a tank (Water Tank), a control section (Control), a vapor generation section (Vapor Generation Plant), a user interface section (User Interface) and a heater control section (Heater Control) as components. Each component exchanges data as shown below.

When a target humidity (target_humidity) is set on the user interface section (User Interface) by a user, the heater control section (Heater Control) refers to the humidity information (target_humidity) on the user interface section (User Interface) and mode information (mode) on the control section (Control) to control a heater. The vapor generation section (Vapor Generation Plant) generates vapor on the basis of fan power information (fan_power) of the control section (control) and heater power information (heater_power) of the heater control section (Heater Control). The control section (Control) determines the mode of the steam-type humidifier on the basis of tank water volume information (water_volume) received from the tank (Water Tank) and vapor temperature information (water_temperature) received from the vapor generation section (Vapor Generation Plant).

In the steam-type humidifier configured as described above, the behavior of the humidifier system itself is modeled as a discrete system with the use of a modeling language such as UML. The physical characteristics, such as water in the humidifier and air in the room, are modeled as a continuous system with the use of a modeling language such as Simulink. Therefore, in the structure model shown in FIG. 4, it is the control section (Control) and the user interface section (User Interface), which are surrounded by broken lines that are described as a discrete system model. It is the tank (Water Tank), the vapor generation section (Vapor Generation Plant) and a heat control section (Heat Control), which are surrounded by dotted lines that are described as a continuous system model.

Therefore, in the structure model of the steam-type humidifier shown in FIG. 4, it is the value of the humidity (target_humidity) handed over from the user interface section (User Interface) to the heat control section (Heat Control), the value of the mode (mode) handed over from the control section (Control) to the heat control section (Heat Control), and the fan power (fan_power) handed over from the control section (Control) to the vapor generation section (Vapor Generation Plant) that are extracted as values to be handed over from the discrete system model to the continuous system model. FIG. 5(a) shows the discrete-continuous correspondence table T1, with which extracted values are registered.

Similarly, in the structure model of the steam-type humidifier shown in FIG. 4, it is the value of the tank water volume (water_volume) handed over from the tank (Water Tank) to the control section (Control), and the value of the vapor temperature (water_temperature) handed over from the vapor generation section (Vapor Generation Plant) to the control section (Control) that are extracted as values to be handed over from the continuous system model to the discrete system model. FIG. 5(b) shows the continuous-discrete correspondence table T2, with which extracted values are registered.

Returning to FIG. 3, the processing proceeds to step 305, where event generating conditional expressions to be evaluated by referring to the value of a variable of the continuous system model, are extracted from the discrete system model next. Specifically, all event generating conditional expressions are extracted from the discrete system model first. Then, from among the extracted event generating conditional expressions, those which include such a variable that the variable name is registered with a "name in discrete system model" field in the continuous-discrete correspondence table T2 are selected. The selected event generating conditional expressions are given unique identifiers and registered with the conditional expression correspondence table T3.

Figure 6:
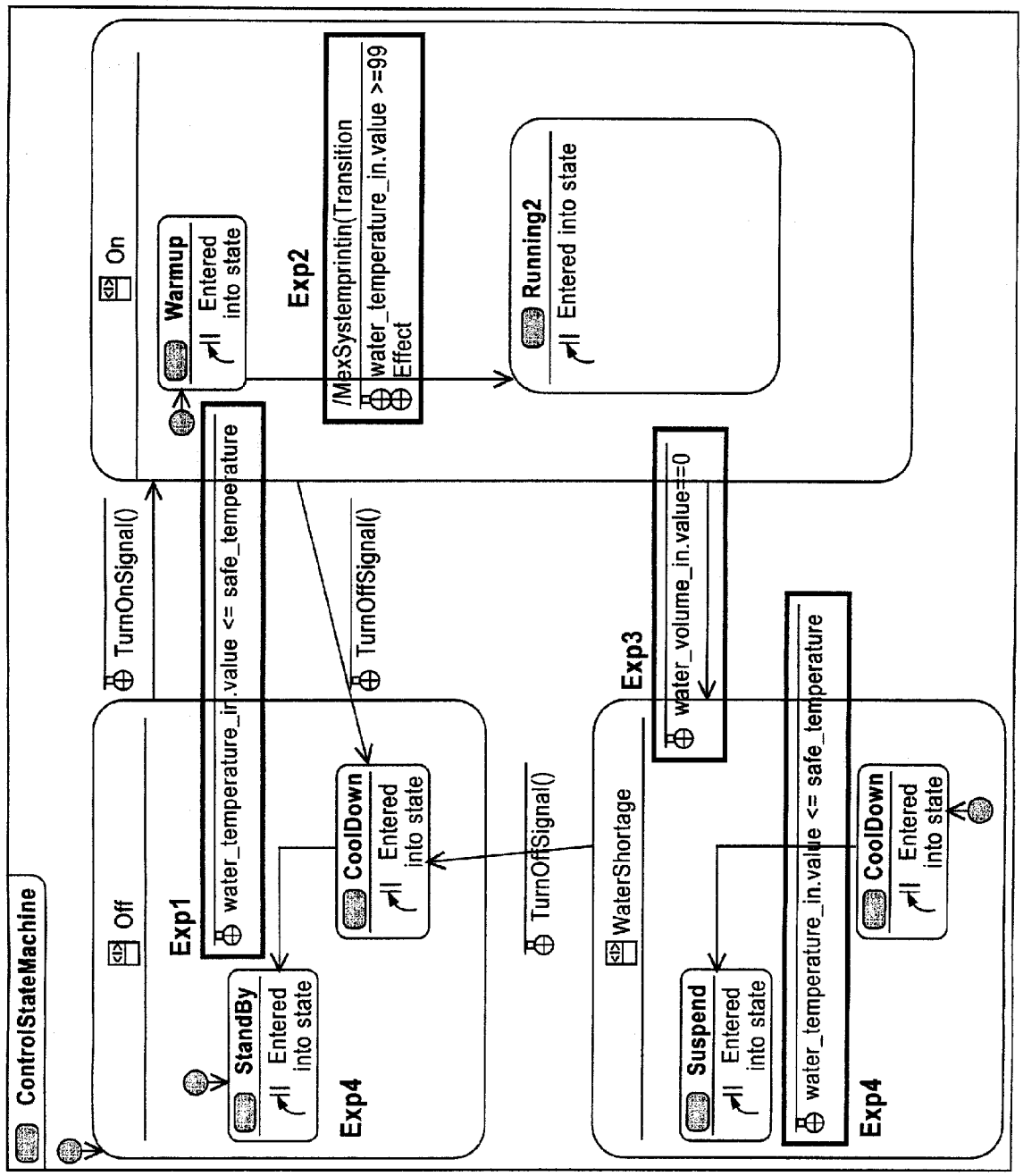
FIG. 6 shows an example of a discrete system model constituting a part of the steam-type humidifier (hybrid system).

The event generating conditional expression extraction processing described above will be described in more detail with reference to FIG. 6, with a steam-type humidifier taken as an example of a hybrid system again. FIG. 6 shows an example of a discrete system model of a steam-type humidifier described by a state machine diagram. As described above, the discrete system model of the steam-type humidifier is obtained by modeling the behavior of the humidifier itself, that is, the behavior of the control section (Control) and the user interface section (User Interface) shown in FIG. 4.

As shown in FIG. 6, the discrete system model of the steam-type humidifier has three roughly classified states, that is, an off state (Off), an on state (On) and a state in which the tank is empty (WaterShortage). Each state can be further classified into two states. That is, the off state (Off) can be further classified into a standby state (Standby) and a cool-down state (CoolDown). The on state (On) can be further classified into a warm-up state (WarmUp) and a running state (Running). The state in which the tank is empty (WaterShortage) can be further classified into a cool-down state (CoolDown) and a suspend state (Suspended). The state transition among the six states will be described below with reference to FIG. 6.

When the steam-type humidifier is powered on via the user interface section (User Interface), the steam-type humidifier is into the warm-up state (WarmUp) of the on state (On) in response to TurnOnSignal. When an event generating conditional expression water_temperature_in.value>=99 is satisfied in this state, the state transitions to the running state (Running) of the on state (On). When an event generating conditional expression water_volume_in.value==0 is satisfied in the on state (On), the steam-type humidifier is into the cool-down state (CoolDown) of the state in which the tank is empty (WaterShortage). When an event generating conditional expression water_temperature_in.value<=safe_temperature is satisfied in this state, the state transitions to the suspend state (Suspended) of the state in which the tank is empty (WaterShortage).

When the steam-type humidifier is powered off via the user interface section (User Interface) in the on state (On) or in the state in which the tank is empty (WaterShortage), the steam-type humidifier is into the cool-down state (CoolDown) of the off state (Off) in response to TurnOffSignal. When the event generating conditional expression water_temperature_in.value<=safe_temperature is satisfied in this state, the state transitions to the standby state (Standby) of the off state (Off).

From the discrete system model of the steam-type humidifier described above, event generating conditional expressions are extracted which include a variable, which refers to the value of a variable of the continuous system model, that is, such a variable that the variable name is registered with the "name in discrete system model" field in the continuous-discrete correspondence table T2. All the four event generating conditional expressions described above include the variable water_temperature_in or the variable water_volume_in, and they are registered with the "name in discrete system model" field in the continuous-discrete correspondence table T2 shown in FIG. 5(b). Therefore, in this embodiment, the entire event generating conditional expressions described above is selected.

Then, the selected four event generating conditional expressions are given unique IDs Exp1, Exp2, Exp3 and Exp4, respectively, and registered with the conditional expression correspondence table T3. When the registration is performed, such variables that refer to the value of a variable of the continuous system model, the names in the discrete system model are converted to names in the continuous system model by referring to the continuous-discrete correspondence table T2. If each event generating conditional expression includes a variable of the discrete system model, which is not included in the continuous-discrete correspondence table T2, its variable name is also registered with the conditional expression correspondence table T3 in association with the event generating conditional expression.

To describe the event generating conditional expression water_temperature_in.value<=safe_temperature which is given the ID Exp1, the variable water_temperature_in.value is a variable that refers to the value of a variable of the continuous system model. Therefore, water_temperature_in.value, which is the name in the discrete system model, is converted to water_temperature_out.value, which is the name in the continuous system model, and registered with the conditional expression correspondence table T3. As the variable safe_temperature is a variable of the discrete system model, which is not included in the continuous-discrete correspondence table T2, it is associated with the event generating conditional expression Exp1 and registered with the conditional expression correspondence table T3. The table shown in FIG. 7 is an example of the conditional expression correspondence table T3 created in this way.

Returning to FIG. 3 again, the processing proceeds to step 310, where a code for recording activeness/inactiveness of all the event generating conditional expressions extracted at step 305 is inserted into the discrete system model. Here, activeness/inactiveness of an event generating conditional expression means that the system state in the discrete system model is into the state of waiting/not waiting for an event by the event generating conditional expression.

Figure 8:
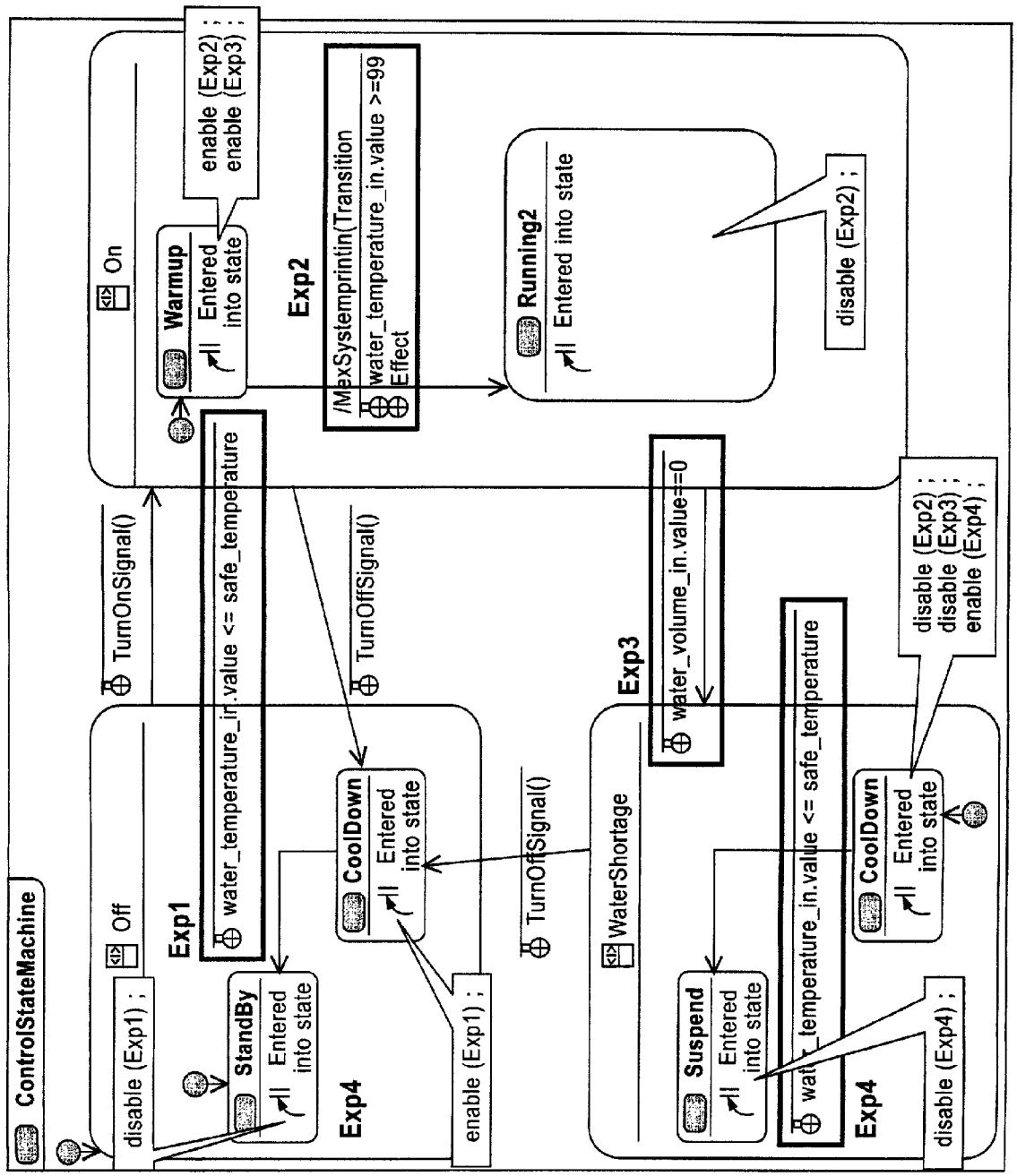
FIG. 8 shows an example of the discrete system model after a code for recording activeness/inactiveness of an event generating conditional expression is inserted by the preprocessing.

FIG. 8 shows an example of the discrete model in which the code for recording activeness/inactiveness of an event generating conditional expression is inserted. Here, a function enable (E) is for recording that an event generating conditional expression E has become active, to the conditional expression activeness table T4. Similarly, a function disable (E) is for recording that the event generating conditional expression E has become inactive, to the conditional expression activeness table T4. The conditional expression activeness table T4 will be described later.

For example, as described with reference to FIG. 6, the discrete model transitions to the running state (Running) when the event generating conditional expression water_temperature_in.value>=99 (Exp2) is satisfied in the warm-up state (WarmUp) of the on state (On). When the event generating conditional expression water_volume_in.value==0 (Exp3) is satisfied, the discrete model transitions to the cool-down state (CoolDown) in the state in which the tank is empty (WaterShortage). Therefore, as shown in the discrete model in FIG. 8, because events by the event generating conditional expressions Exp2 and Exp3 are waited for, in the warm-up state (WarmUp) of the on state (On), the codes enable (Exp2) and enable (Exp3) are inserted. On the other hand, in the transition-destination running state (Running) after an event by the event generating conditional expression Exp2 occurs, the code disable (Exp2) is inserted because an event by the event generating conditional expression Exp2 is not waited for.

Returning to FIG. 3, the processing proceeds to step 315, where a working data area for the discrete system simulation section 200 is created on the basis of the conditional expression correspondence table T3. Specifically, a conditional expression activeness table T4 configured by (ID and activeness/inactiveness) is created for each entry in the conditional expression correspondence table T3. FIG. 9(a) shows a conditional expression activeness table T4 created on the basis of the conditional expression correspondence table T3 shown in FIG. 7. When the table is created, "inactive" is registered with the "active/inactive" field for the entire event generating conditional expressions, and initialization is performed.

The processing proceeds from step 315 to step 320, where a working data area for the continuous system simulation section 300 is created on the basis of the conditional expression correspondence table T3 next. Specifically, a conditional expression activeness table T5 configured by (ID and activeness/inactiveness) is created for each entry in the conditional expression correspondence table T3. FIG. 9(b) shows a conditional expression activeness table T5 created on the basis of the conditional expression correspondence table T3 shown in FIG. 7. Again, when the table is created, "inactive" is registered with the "active/inactive" field for the entire event generating conditional expressions, and initialization is performed. Furthermore, for all the variables registered with the "variable" field of the discrete system model referred to by the conditional expression correspondence table T3, a discrete system model variable value table T6 configured by (variable name and value) is created. FIG. 9(c) shows a discrete system model variable value table T6 created on the basis of the conditional expression correspondence table T3 shown in FIG. 7. When the table is created, "a value indicating "undecided"" is registered for all the variables, and initialization is performed. Then, the preprocessing ends.

Each of the tables created in the preprocessing in this way is stored in each of the data storage sections of the discrete system simulation section 200 and the continuous system simulation section 300. Specifically, in the data storage section of the discrete system simulation section 200, the discrete-continuous correspondence table T1, the conditional expression correspondence table T3 and the conditional expression activeness table T4 are stored. In the data storage section of the continuous system simulation section 300, the continuous-discrete correspondence table T2, the conditional expression correspondence table T3, the conditional expression activeness table T5 and the discrete system model variable value table T6 are stored.

Next, returning to FIG. 1, the functional configuration of the simulation apparatus 100 of the hybrid system will be described in detail. The event processing section 205 of the discrete system simulation section 200 performs processing of an event scheduled at the current time currentTime. If an event newly occurs due to the processing of the event, the event processing section 205 immediately processes the occurred event if it is an event to be immediately processed. On the other hand, if the occurred event is an event to be processed after a specified time, the event processing section 205 registers the event with a scheduler. If the functions enable (E) and disable (E) embedded by the preprocessing are executed by the processing of the event by the event processing section 205, the value of the "active/inactive" field for a corresponding event generating conditional expression in the conditional expression activeness table T4 is updated.

The request message creation section 210 creates a request message to be transmitted to the continuous system simulation section 300 in response to the end of processing of an event by the event processing section 205. Creation of the request message performed is described below. (1) First, the ID of such an event generating conditional expression that the value of the "active/inactive" field is "active" is extracted from the conditional expression activeness table T4. (2) Next, the variable name and value of a variable of the discrete system model which is used in an event generating conditional expression having the extracted ID are extracted by referring to the conditional expression correspondence table T3.

(3) Furthermore, the variable name and value of a variable of the discrete system model which is referred to by the continuous system simulation section 300 are extracted by referring to the discrete-continuous correspondence table T1. The extracted variable name in the discrete system model is converted to a variable name in the continuous system model. Lastly, by adding the occurrence time of the next event registered with the scheduler to all the data extracted at (1) to (3), a request message is completed. When the request message is completed, the request message creation section 210 transmits it to the continuous system simulation section 300. In this way, the discrete system simulation section 200 according to the embodiment of the present invention makes it possible to evaluate an event generating conditional expression evaluated by referring to the value of a variable of the continuous system model, in the continuous system simulation section 300.

The response acceptance section 215 receives a response message to a request message, from the continuous system simulation section 300. The response message includes current time data indicating the current time currentTime in the continuous system simulation section 300, the ID of an event generating conditional expression evaluated to be true, and the variable name and value of a variable of the continuous system model, which is referred to by the discrete system simulation section 200, though the details will be described later. However, the variable name of the variable of the continuous system model has been converted to a name in the discrete system model. The response acceptance section 215 hands over the variable name and value of the variable of the discrete system model in the response message, to the continuous system data update section 220. The response acceptance section 215 also hands over the current time data in the response message to the time update section 225.

The continuous system data update section 220 updates a variable of the discrete system model, which refers to a variable of the continuous system model on the basis of data received from the response acceptance section 215. The time update section 225 updates the current time currentTime in the discrete system simulation section 200 on the basis of data received from the response acceptance section 215. The event processing section 205 repeats processing of an event in the transition-destination state determined on the basis of the ID of an event generating conditional expression evaluated to be true, in response to update of time by the time update section 225.

As for simulation by the continuous system simulation section 300, processing is started by receiving a request message from the discrete system simulation section 200. When receiving a request message, the request acceptance section 305 updates the conditional expression activeness table T5 and the discrete system model variable value table T6 on the basis of the ID of an event generating conditional expression and the variable name and value of a variable of the discrete system model, which are included in the request message. The request acceptance section 305 also updates a variable of the continuous system model which refers to a variable of the discrete system model on the basis of a variable of the continuous system model and its value, which are included in the request message. Furthermore, the request acceptance section 305 temporarily stores data of the occurrence time of the next event, which is included in the request message in a data area.

The step execution section 310 executes simulation of advancing the current time of the continuous system model by a step time interval in response to data update by the request acceptance section 305. As described above, the continuous system simulation section 300 according to this embodiment sets what is obtained by describing a target expressed by a numerical formula, such as a differential equation, as a continuous value algorithm for calculating an output value from an input value, as a behavior model. Accordingly, the step execution section 310 advances simulation by determining an output value at time $t_{i+1}$ on the basis of an input value at current time $t_i$. When executing one step of simulation, the step execution section 310 increases the current time currentTime by time corresponding to a step time.

The conditional expression evaluation section 315 refers to the conditional expression activeness table T5 and reads all active event generating conditional expressions from the conditional expression correspondence table T3. Then, the conditional expression evaluation section 315 refers to the value of a variable of the discrete system model registered with the discrete system model variable value table T6 and sequentially evaluates the read event generating conditional expressions. If any of evaluations of the event generating conditional expressions does not indicate true, that is, the condition of any event generating conditional expression is not satisfied, then the conditional expression evaluation section 315 hands over control to the schedule confirmation section 320. On the other hand, if any one of evaluations of the event generating conditional expressions indicates true, then the conditional expression evaluation section 315 hands over the ID of the event generating conditional expression evaluated to be true to the response message creation section 325.

When control is handed over from the conditional expression evaluation section 315, the schedule confirmation section 320 reads data of the occurrence time of the next event from a data area and compares it with the current time currentTime in the continuous system simulation section 300. If the occurrence time of the next event equals the current time currentTime, the schedule confirmation section 320 hands over control to the response message creation section 325. On the other hand, if the occurrence time of the next event is after the current time currentTime, the schedule confirmation section 320 hands over control to the step execution section 310.

In response to receiving the ID of an event generating conditional expression from the conditional expression evaluation section 315 or when control is handed over from the schedule confirmation section 320, the response message creation section 325 creates a response message to a request message from the discrete system simulation section 200. The response message is created as follows. (1) First, the continuous-discrete correspondence table T2 is referred to, and the variable name and value of a variable of the continuous system model, which is referred to by the discrete system simulation section 200, are extracted. Here, the extracted variable name in the continuous system model is converted to a variable name in the discrete system model.

(2) Current time data indicating the current time currentTime in the continuous system simulation section 300 is acquired. (3) If the ID of an event generating conditional expression is received, it is added to all the data acquired at (1) to (2). Then, a response message is completed. When the response message is completed, the response message creation section 325 transmits it to the discrete system simulation section 200. In this way, the continuous system simulation section 300 according to the embodiment of the present invention makes it unnecessary to notify a simulation result to a discrete system simulator at each step time interval unless the result of an event generating conditional expression indicates true or unless the current time currentTime has reached the occurrence time of the next event.

Figure 10:
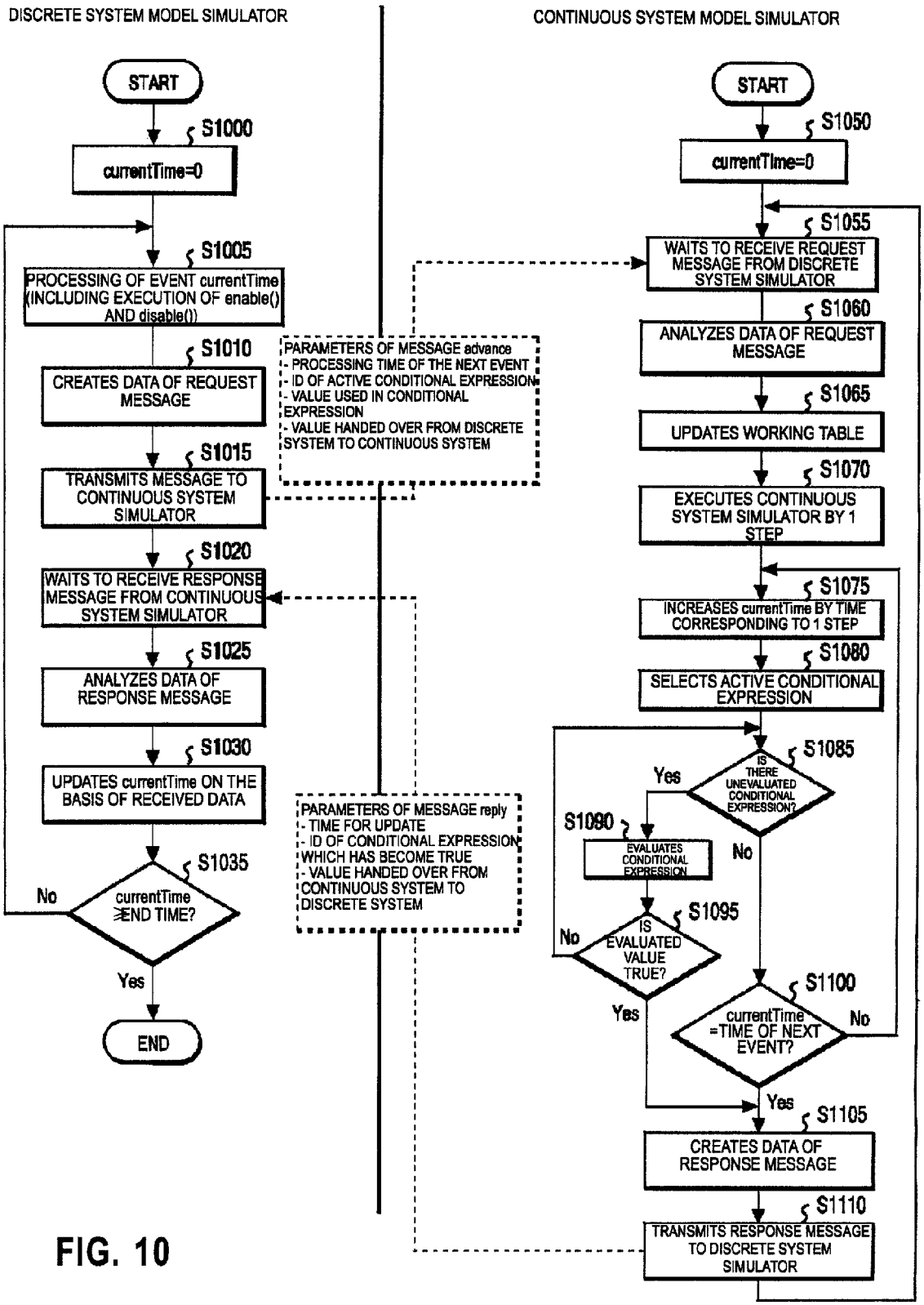
FIG. 10 shows a flowchart showing an example of the processing flow of simulation of the hybrid system according to this embodiment.

Next, an example of the flow of processing of simulation by the discrete system simulation section 200 and simulation by the continuous system simulation section 300 according to the embodiment of the present invention will be described with reference to FIG. 10. In FIG. 10, simulation by the discrete system simulation section 200 starts at step 1000. First, the discrete system simulation section 200 initializes the value of the current time currentTime with 0. Next, the discrete system simulation section 200 processes an event at the time currentTime (step 1005). As described above, processing of an event may include execution of functions enable( ) and disable( ).

On the other hand, in FIG. 10, simulation by the continuous system simulation section 300 starts at step 1050. The continuous system simulation section 300 first initializes the value of the current time currentTime with 0. Then, the continuous system simulation section 300 waits for a request message from the discrete system simulation section 200 (step 1055).

When the processing of the event ends at step 1005, the discrete system simulation section 200 creates a request message requesting evaluation of an event generating conditional expression evaluated by referring to a variable of the continuous system model next (step 1010), and transmits it to the continuous system simulation section 300 (step 1015).

Though description of a method for creating a request message is omitted here to avoid repetition, a request message includes the occurrence time of the next event in the discrete system model, the ID of an active conditional expression, the value of a variable used in the conditional expression, and the value of a variable of the discrete system model, which is referred to by the continuous system simulation section 300. However, the variable name of the variable of the discrete system model has been converted to a variable name in the continuous system model.

When receiving the request message from the discrete system simulation section 200, the continuous system simulation section 300 analyzes the request message (step 1060), and updates working tables, that is, the conditional expression activeness table T5 and the discrete system model variable value table T6 with data included in the request message (step 1065). The continuous system simulation section 300 also updates a variable of the continuous system model which refers to a variable of the discrete system model with data included in the request message.

After updating the data, the continuous system simulation section 300 executes simulation of advancing the current time of the continuous system model by a step time interval (step 1070), and increases the current time currentTime held by the continuous system simulation section 300 by time corresponding to a step time (step 1075). Then, the continuous system simulation section 300 selects one of the IDs of active conditional expressions from the conditional expression activeness table T5 (step 1080). If the ID of an active conditional expression, which has not been evaluated, exists in the conditional expression activeness table T5 (step 1085: YES), the continuous system simulation section 300 evaluates an event generating conditional expression having the selected ID by referring to the conditional expression correspondence table T3 and the discrete system model variable value table T6 (step 1090).

If the result of the evaluation of the event generating conditional expression indicates false (step 1095: NO), the processing returns to step 1080, and the continuous system simulation section 300 selects one of the IDs of active conditional expressions, which have not been selected yet, from the conditional expression activeness table T5 and repeats the above processing.

On the other hand, if the ID of an active conditional expression, which has not been evaluated, does not exist in the conditional expression activeness table T5 (step 1085: NO), the continuous system simulation section 300 compares the occurrence time of the next event in the discrete system model, which is included in the request message, and the current time currentTime held by the continuous system simulation section 300 (step 1100). If the current time currentTime is time before the occurrence time of the next event (step 1100: NO), the processing returns to step 1070. The continuous system simulation section 300 again executes the simulation of advancing the current time of the continuous system model by a step time interval.

If the result of the evaluation of the event generating conditional expression indicates true at step 1095, or if the current time currentTime is the occurrence time of the next event at step 1100, the processing proceeds to step 1105, and the continuous system simulation section 300 creates a response message to the request message from the discrete system simulation section 200. Though description of a method for creating a response message is omitted here to avoid repetition, a response message includes current time data indicating the current time currentTime in the continuous system simulation section 300, the ID of the event generating conditional expression, which has been evaluated to be true, and the value of a variable of the continuous system model, which is referred to by the discrete system simulation section 200. However, the variable name of the variable of the continuous system model has been converted to a variable name in the discrete system model.

Then, the continuous system simulation section 300 transmits the completed response message to the discrete system simulation section 200 (step 1110).

When receiving the response message from the continuous system simulation section 300, the discrete system simulation section 200 analyzes the response message (step 1025), and updates the current time currentTime in the discrete system model with data included in the response message (step 1030). The discrete system simulation section 200 also updates a variable of the discrete system model, which refers to a variable of the continuous system model with data included in the response message.

After that, the discrete system simulation section 200 compares the current time currentTime with the simulation end time (step 1035). If the current time currentTime is time before the end time (step 1035: NO), the processing returns to step 1005. The discrete system simulation section 200 determines a state to transition to, on the basis of the ID of the event generating conditional expression included in the response message and executes processing of an event in that state. On the other hand, if the current time currentTime is the end time or after the end time (step 1035: YES), the simulation ends.

Figure 11:
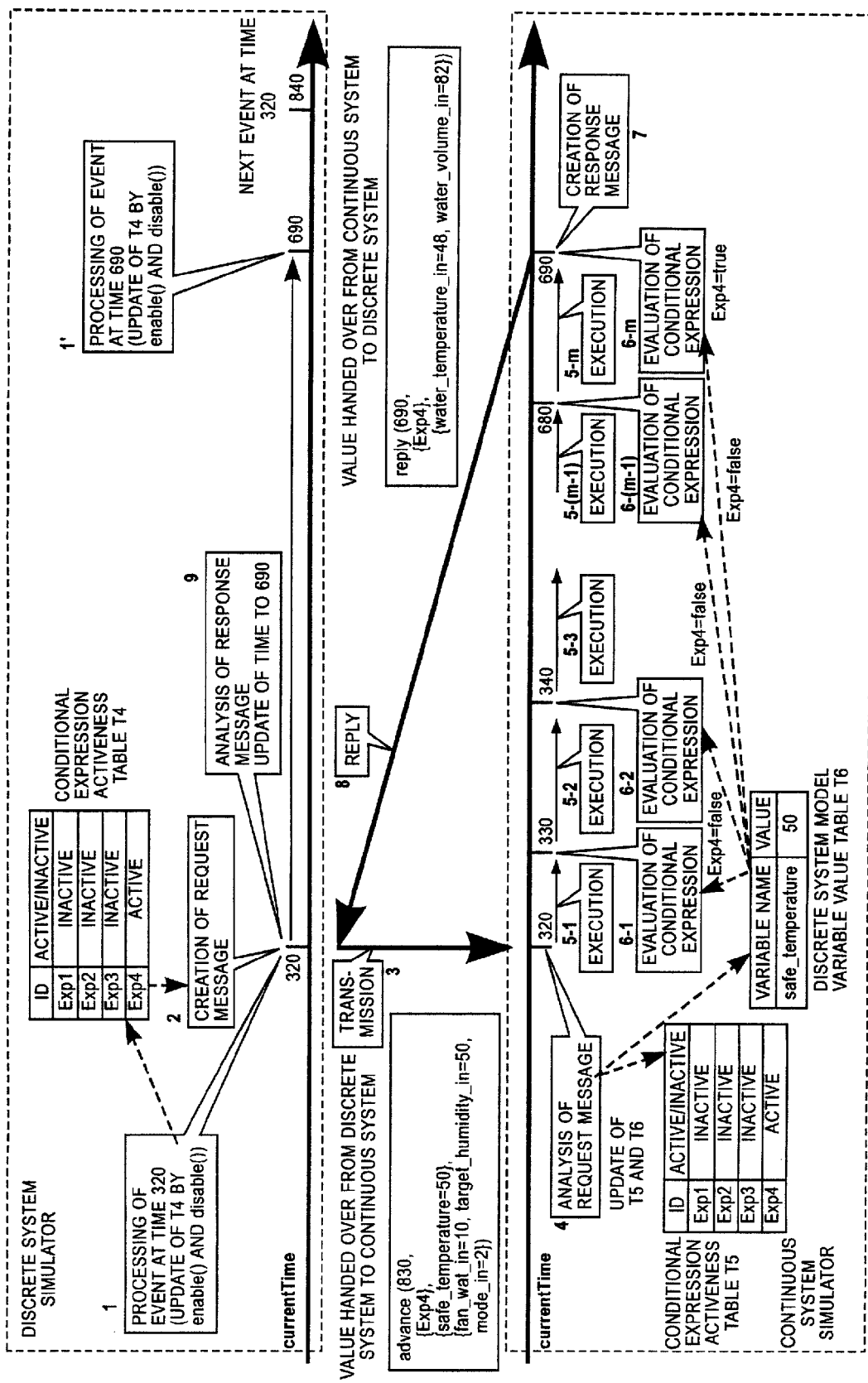
FIG. 11 shows an execution example of simulation to which the present invention is applied, for a steam-type humidifier (hybrid system) model.

Next, an execution example in which the present invention is applied to simulation of a steam-type humidifier (hybrid system) model will be described with reference to FIG. 11. It is assumed that the tables shown in FIGS. 5, 7 and 9 have been created and prepared as a result of preprocessing. In FIG. 11, the upper-side axis indicates the time axis of the discrete system simulator and the lower-side axis indicates the time axis of the continuous system simulator. The numbers shown in the diagram indicate the order of execution of simulations by the discrete system simulator or the continuous system simulator.

At time 320, the discrete system simulator processes an event. Here, it is assumed that the function enable (Exp4) is executed, and the "active/inactive" field for Exp4 is updated to "active" in the conditional expression activeness table T4, by the processing of the event. Then, the discrete system simulator refers to the conditional expression activeness table T4 and creates a request message advance {830, {Exp4}, {safe_temperature=50}, {fan_wat_in=10, Target_humidity_in=50}, mode_in=20}}, which includes the ID of the active event generating conditional expression. Data included in the message are: the occurrence time of the next event, the ID of the active conditional expression, the value of a variable of the discrete system model used in the conditional expression, and a value handed over from the discrete system model to the continuous system model, in that order from the top.

The continuous system simulator receives the request message at time 320, and updates the conditional expression activeness table T5 and the discrete system model variable value table T6 on the basis of the data included in the request message. The conditional expression activeness table T5 is updated, and the "active/inactive" field for Exp4 is changed to "active". The discrete system model variable value table T6 is updated, and the "value" field for safe_temperature is changed to 50. The continuous system simulator also updates a variable of the continuous system model, which refers to a variable of the discrete system model on the basis of the data included in the request message. After that, the continuous system simulator repeats the simulation of advancing the current time by a step time interval and evaluation of the event generating conditional expression Exp4 until evaluation of the active event generating conditional expression Exp4 indicates true.

In this embodiment, evaluation of the event generating conditional expression Exp4 indicates true for the first time at time 690 when execution of one step of simulation and evaluation of the event generating conditional expression Exp4 are repeated m times, as shown in FIG. 11. Therefore, the event generating conditional expression becomes true before occurrence time 840 of the next event, and the continuous system simulator creates a response message reply {690, {Exp4}, {water_temperature_in=48, water_volume_in=82}} to the request message when evaluation of the event generating conditional expression Exp4 indicates true at the time 690. Data included in the message are: time to be updated (the current time on the continuous system simulator side), the ID of the conditional expression, which has become true, a value handed over from the continuous system model to the discrete system model, in that order from the top.

The discrete system simulator receives the response message at the time 320 and updates the current time 320 to 690 on the basis of data included in the response message. The discrete system simulator also updates a variable of the discrete system model, which refers to a variable of the continuous system model on the basis of data included in the response message. Then, the discrete system simulator determines a transition-destination state on the basis of the ID of the conditional expression, which has become true, and executes the processing of an event in that state.

When simulation of a steam-type humidifier model is performed by applying the present invention in the scenario of performing a switch-off operation after a switch-on operation, communication is performed only eight times though the conventional method in which synchronization of time and data is performed for each step time requires four hundred communications even if data is collected and transmitted.

The present invention has been described above with an embodiment. However, the technical scope of the present invention is not limited to the scope described in the above embodiment. Those skilled in the art recognize that various changes or improvements can be made in the above embodiment. For example, the request message creation section 210 includes a variable to be handed over from the discrete system model to the continuous system model, into a request message irrespective of whether or not the value has been changed from a value transmitted the last time. However, from the viewpoint of reducing the amount of communicated data between the discrete system simulation section 200 and the continuous system simulation section 300, it is also possible to record the variable names and values of variables to be transmitted and include, for only such a variable that the value has been changed from a value transmitted the last time, the variable name and value into a request message. The same goes for the response message creation section 325.

In the embodiment described above, a code for recording activeness/inactiveness of an event generating conditional expression is inserted into the discrete system model in order to check which event occurrence is currently waited for in the discrete system model. However, for example, in the case where it is difficult to change the discrete system model itself, a method as follows may be adopted instead, that is, a method in which a table of correspondence between states of the discrete system model and the IDs of active event generating conditional expressions in the states (see FIG. 12) is created in the preprocessing, and, when simulation is executed, active event generating conditional expressions are determined from the state of the discrete system model, with the use of the correspondence table. Therefore, embodiments in which such changes are made are included in the technical scope of the present invention.

What is claimed is:

1. A non-transitory continuous system simulation program product that simulates the behavior of a continuous system constituting a hybrid system together with a discrete system while communicating with a discrete system simulation program that simulates the behavior of the discrete system, the continuous system simulation program product causing a computer to execute the steps of:
receiving a request for evaluation of an event generating conditional expression, for an event to be processed by the discrete system simulation program, from the discrete system simulation program, wherein the event generating conditional expression is evaluated by referring to a value of at least one continuous system variable among multiple continuous system variables describing the continuous system;
repeating simulation of advancing the current time of the continuous system by a step time interval and evaluation of the event generating conditional expression Until evaluation of the event generating conditional expression indicates true, in response to the receiving of the request for evaluation;
recording the value of at least one continuous system variable referred to in simulation of the discrete system before sending the value to the discrete system simulation program;
sending current time data indicating the current time and the value of at least one continuous system variable referred to in simulation of the discrete system among the multiple continuous system variables to the discrete system simulation program, in response to evaluation of the event generating conditional expression indicating true; and
in the case of sending the value of at least one continuous system variable to the discrete system simulation program in response to evaluation of the event generating conditional expression indicating true, canceling transmission of the value of at least one continuous system variable on condition that the value has not changed.

2. The continuous system simulation program product according to claim 1, further causing the computer to execute the step of receiving the value of at least one discrete system variable referred to in simulation of the continuous system, among multiple discrete system variables which are variables describing the discrete system, from the discrete system simulation program together with the request for evaluation.

3. The continuous system simulation program product according to claim 1, further causing the computer to execute the steps of:
receiving the occurrence time of an event scheduled in the nearest future, among events to be processed by the discrete system simulation program, from the discrete system simulation program together with the request for evaluation;
judging whether or not the current time has reached the occurrence time of the event if, in evaluation of the event generating conditional expression for each simulation of advancing the current time by a step time interval, the result does not indicate true; and
sending the value of at least one continuous system variable referred to in simulation of the discrete system among the multiple continuous system variables to the discrete system simulation program, in response to the current time reaching the occurrence time of the event.

4. A non-transitory discrete system simulation program product that simulates the behavior of a discrete system constituting a hybrid system together with a continuous system while communicating with a continuous system simulation program that simulates the behavior of the continuous system, the discrete system simulation program product causing a computer to execute the steps of:
processing an event that occurs at the current time;
sending a request for evaluation of an event generating conditional expression evaluated by referring to a value of at least one continuous system variable among multiple continuous system variables, which are variables describing the continuous system to the continuous system simulation program, in response to the end of the processing of the event;
receiving current time data indicating the time when the result of evaluation of the event generating conditional expression indicates true and the value of at least one continuous system variable referred in simulation of the discrete system among the multiple continuous system variables from the continuous system simulation program;
recording the value of at least one continuous system variable referred to in simulation of the discrete system before sending the value to the discrete system simulation program;
in the case of sending the value of at least one continuous system variable to the discrete system simulation program in response to evaluation of the event generating conditional expression indicating true, canceling transmission of the value of at least one continuous system variable on condition that the value has not changed;
recording the value of at least one continuous system variable received from the continuous system simulation program to a storage section of the computer; and
updating the current time with the received current time data.

5. The discrete system simulation program product according to claim 4, wherein the request for evaluation is a request for evaluation of an event generating conditional expression, which needs evaluation due to the processing of the event, among one or more event generating conditional expressions evaluated by referring to the value of at least one continuous system variable among the multiple continuous system variables.

6. The discrete system simulation program product according to claim 4, further causing the computer to execute the step of sending the value of at least one discrete system variable referred to in simulation of the continuous system, among multiple discrete system variables, which describe the discrete system and which have been updated by the processing of the event, to the continuous system simulation program together with the request for evaluation, in response to the end of the processing of the event.

7. The discrete system simulation program product according to claim 4, further causing the computer to execute the steps of:
in response to the end of the processing of the event, sending the occurrence time of an event scheduled next to the event to the continuous system simulation program together with the request for evaluation; and
receiving the value at the occurrence time, of at least one continuous system variable referred to in simulation of the discrete system among the multiple continuous system variables, from the continuous system simulation program.

8. The discrete system simulation program product according to claim 4, further causing the computer to execute the step of processing of the event by referring to the value of at least one continuous system variable, which has been recorded to the storage section, in response to update of the current time.

9. A non-transitory simulation program product for a hybrid system including a discrete system simulation program that simulates the behavior of a discrete system constituting the hybrid system and a continuous system simulation program that simulates the behavior of a continuous system constituting the hybrid system while communicating with the program, wherein:
   (a) the discrete system simulation program causing a computer to execute the steps of:
      processing an event that occurs at the current time in the discrete system; and
      handing over a request for evaluation of an event generating conditional expression evaluated by referring to a value of at least one continuous system variable among multiple continuous system variables, which are variables describing the continuous system to the continuous system simulation program, in response to the end of the processing of the event;
   (b) the continuous system simulation program causing the computer to execute the steps of:
      repeating simulation of advancing the current time of the continuous system by a step time interval and evaluation of the event generating conditional expression until evaluation of the event generating conditional expression indicates true, in response to the receiving of the request for evaluation;
      recording the value of at least one continuous system variable referred to in simulation of the discrete system before sending the value to the discrete system simulation program;
      handing over the value of current time data indicating the current time in the continuous system and the value of at least one continuous system variable referred to in simulation of the discrete system among the multiple continuous system variables to the discrete system simulation program, in response to evaluation of the event generating conditional expression indicating true; and
      in the case of sending the value of at least one continuous system variable to the discrete system simulation program in response to evaluation of the event generating conditional expression indicating true, canceling transmission of the value of at least one continuous system variable on condition that the value has not changed; and
   (c) the discrete system simulation program further causing the computer to execute the steps of:
      updating current time data indicating the current time in the discrete system with the value of the current time data received from the continuous system simulation program; and
      processing an occurred event by referring to the value of at least one continuous system variable, which has been received from the continuous system simulation program, in response to update of the current time data.

10. A continuous system simulation method for simulating the behavior of a continuous system constituting a hybrid system together with a discrete system while communicating with a discrete system simulator that simulates the behavior of the discrete system, the method being executed by a computer, and the method comprising the steps of:
   the computer receiving a request for evaluation of an event generating conditional expression, for an event to be processed by the discrete system simulator, from the discrete system simulator, wherein the event generating conditional expression is evaluated by referring to a value of at least one continuous system variable among multiple continuous system variables describing the continuous system;
   the computer repeating simulation of advancing the current time of the continuous system by a step time interval and evaluation of the event generating conditional expression until evaluation of the event generating conditional expression indicates true, in response to the receiving of the request for evaluation;
   the computer recording the value of the at least one continuous system variable referred to in simulation of the discrete system before sending the value to the discrete system simulation program;
   the computer sending current time data indicating the current time and the value of at least one continuous system variable referred to in simulation of the discrete system among the multiple continuous system variables to the discrete system simulator, in response to evaluation of the event generating conditional expression indicating true; and
   in the case of sending the value of at least one continuous system variable to the discrete system simulation program in response to evaluation of the event generating conditional expression indicating true, the computer canceling transmission of the value of at least one continuous system variable on condition that the value has not changed.

11. A discrete system simulation method for simulating the behavior of a discrete system constituting a hybrid system together with a continuous system while communicating with a continuous system simulator that simulates the behavior of the continuous system, the method being executed on a computer, and the method comprising the steps of:
   the computer processing an event that occurs at the current time;
   the computer sending a request for evaluation of an event generating conditional expression evaluated by referring to a value of at least one continuous system variable among multiple continuous system variables, which are variables describing the continuous system to the continuous system simulator, in response to the end of the processing of the event;
   the computer receiving current time data indicating the time when the result of evaluation of the event generating conditional expression indicates true and the value of at least one continuous system variable referred in simulation of the discrete system among the continuous system variables from the continuous system simulator;
   the computer recording the value of the at least one continuous system variable referred to in simulation of the discrete system before sending the value to the discrete system simulation program;

in the case of sending the value of at least one continuous system variable to the discrete system simulation program in response to evaluation of the event generating conditional expression indicating true, the computer canceling transmission of the value of at least one continuous system variable on condition that the value has not changed;

the computer recording the received value of at least one continuous system variable to a storage section of the computer; and the computer updating the current time with the received current time data.

* * * * *